US011373721B1

(12) United States Patent
Su

(10) Patent No.: US 11,373,721 B1
(45) Date of Patent: Jun. 28, 2022

(54) SIGNAL VERIFICATION SYSTEM

(71) Applicant: CHANGXIN MEMORY TECHNOLOGIES, INC., Hefei (CN)

(72) Inventor: Pengzhou Su, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/441,219

(22) PCT Filed: Jun. 30, 2021

(86) PCT No.: PCT/CN2021/103856
§ 371 (c)(1),
(2) Date: Sep. 20, 2021

(87) PCT Pub. No.: WO2022/095481
PCT Pub. Date: May 12, 2022

(30) Foreign Application Priority Data

Nov. 6, 2020 (CN) .......................... 202011233497.3

(51) Int. Cl.
*G11C 29/02* (2006.01)
*G11C 29/42* (2006.01)
(Continued)

(52) U.S. Cl.
CPC .......... *G11C 29/025* (2013.01); *G11C 7/1075* (2013.01); *G11C 8/06* (2013.01);
(Continued)

(58) Field of Classification Search
CPC ..... G11C 29/025; G11C 29/42; G11C 7/1075; G11C 8/06; G11C 8/18; H03K 19/21
(Continued)

(56) References Cited

U.S. PATENT DOCUMENTS

| 4,523,314 A | 6/1985 | Burns et al. |
| 6,026,051 A * | 2/2000 | Keeth .................. G11C 7/1087 365/194 |

(Continued)

FOREIGN PATENT DOCUMENTS

| CN | 108538337 A | 9/2018 |
| CN | 110364213 A | 10/2019 |
| CN | 111199769 A | 5/2020 |

OTHER PUBLICATIONS

International Search Report and English Translation cited in PCT/CN2021/103856 dated Sep. 15, 2021, 9 pages.
(Continued)

*Primary Examiner* — Son L Mai
(74) *Attorney, Agent, or Firm* — Cooper Legal Group, LLC

(57) ABSTRACT

Embodiments of the present disclosure provide a signal verification system, including: a memory controller, a memory, and a first transmission path and a second transmission path connected between the memory controller and the memory, where the memory controller sends one or more to-be-check signals through the first transmission path, and sends a check signal through the second transmission path, where the second transmission path is a single-port channel, and the check signal is a multi-bit signal; and a comparison module, connected to an output end of a first conversion component and an output end of the second transmission path, and configured to obtain and compare an output signal of the first conversion component and an output signal of the second transmission path.

13 Claims, 1 Drawing Sheet

(51) Int. Cl.
*H03K 19/21* (2006.01)
*G11C 8/06* (2006.01)
*G11C 8/18* (2006.01)
*G11C 7/10* (2006.01)

(52) U.S. Cl.
CPC ............... *G11C 8/18* (2013.01); *G11C 29/42* (2013.01); *H03K 19/21* (2013.01)

(58) Field of Classification Search
USPC ........................................................ 714/764
See application file for complete search history.

(56) References Cited

U.S. PATENT DOCUMENTS

| | | |
|---|---|---|
| 6,519,734 B1 | 2/2003 | Bodnar et al. |
| 7,802,166 B2 * | 9/2010 | Nygren ............... G06F 11/1004 |
| | | 714/6.2 |
| 10,482,947 B2 | 11/2019 | Cox et al. |
| 10,541,897 B2 * | 1/2020 | Siddaiah ............. H04L 43/0852 |
| 10,754,563 B2 * | 8/2020 | Jung ..................... G06F 3/0673 |
| 10,802,759 B2 | 10/2020 | Choi |
| 2016/0372211 A1 | 12/2016 | Lin |

OTHER PUBLICATIONS

Written Opinion and English Translation cited in PCT/CN2021/103856 dated Sep. 15, 2021, 9 pages.

* cited by examiner

US 11,373,721 B1

SIGNAL VERIFICATION SYSTEM

CROSS-REFERENCE TO RELATED APPLICATIONS

The present disclosure is based on and claims the priority to Chinese Patent Application No. 202011233497.3, titled "SIGNAL VERIFICATION SYSTEM", and filed on Nov. 6, 2020, the entire contents of which are herein incorporated into the present disclosure for reference.

TECHNICAL FIELD

Embodiments of the present disclosure relate to, but are not limited to, a signal verification system.

BACKGROUND

Signal accuracy is particularly important during command and address transmission and control of a memory. If a signal received by the memory is different from a signal sent by a memory controller, the memory may be incapable of implementing a correct function, causing disorder in an entire system including the memory and the memory controller. Therefore, the signal received by the memory needs to be verified.

Currently, parity check is used in most signal verification mechanisms in the memory field, resulting in a low accuracy rate.

SUMMARY

Embodiments of the present disclosure provide a signal verification system, including: a memory controller, a memory, and a first transmission path and a second transmission path connected between the memory controller and the memory, where the memory controller sends one or more to-be-check signals through the first transmission path, and sends a check signal through the second transmission path, where the second transmission path is a single-port channel, and the check signal is a multi-bit signal; conversion components, including a first conversion component and a second conversion component, where the first conversion component is connected to an output end of the first transmission path, the second conversion component is connected to an input end of the second transmission path, and the conversion components are configured to convert one or more the to-be-check signals into the check signal; and a comparison module, located in the memory, connected to an output end of the first conversion component and an output end of the second transmission path, and configured to obtain and compare an output signal of the first conversion component and an output signal of the second transmission path.

BRIEF DESCRIPTION OF THE DRAWINGS

The drawings incorporated into the specification and constituting a part of the specification illustrate the embodiments of the present disclosure, and are used together with the description to explain the principles of the embodiments of the present disclosure. In these drawings, similar reference numerals are used to represent similar elements. The drawings in the following description are a part rather than all of the embodiments of the present disclosure. A person skilled in the art may obtain other drawings based on these drawings without creative efforts.

REFERENCE NUMERALS

10. Memory controller; 11. Memory; 121. First transmission path; 122. Second transmission path; 131. First conversion component; 132. Second conversion component; 141. First addition unit; 142. Second addition unit; 15. Remainder unit; 151. First remainder unit; 152. Second remainder unit; 153. Third remainder unit; 253. Third remainder unit; 254. Fourth remainder unit; 161. First exclusive OR operation unit; 17. Comparison module; 18. Sampling module; 19. Control module.

DETAILED DESCRIPTION

The following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by a person of ordinary skill in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
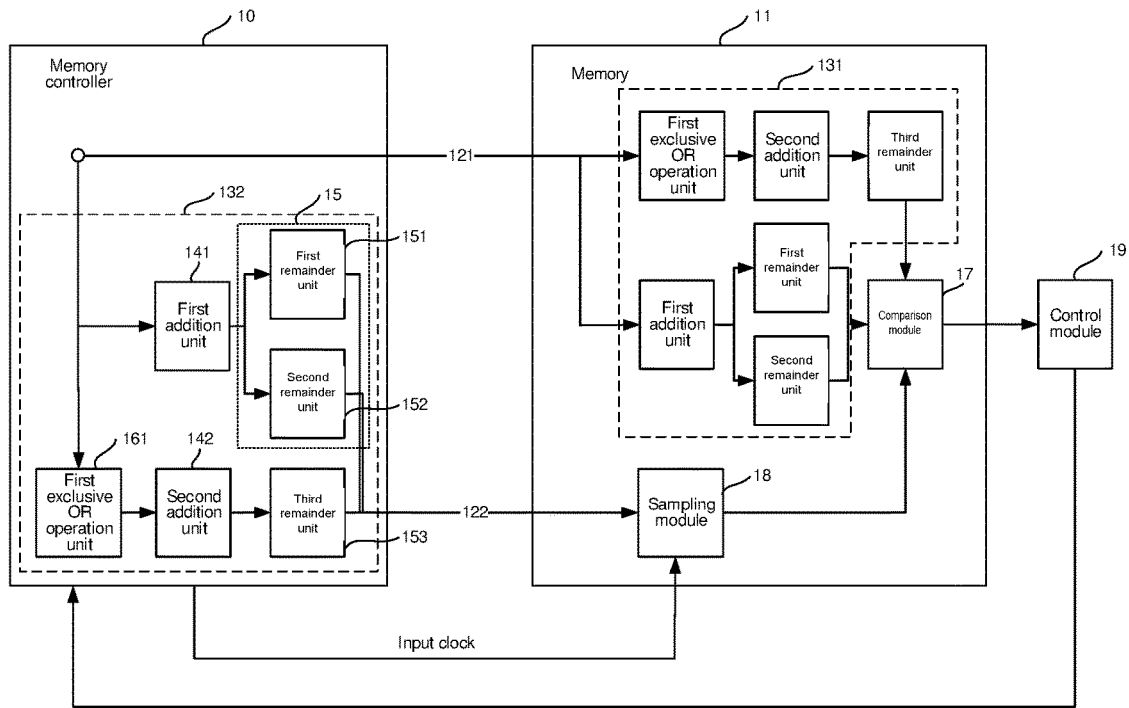
FIG. 1 is a schematic diagram of a functional structure of a signal verification system according to an embodiment of the present disclosure.

FIG. 1 is a schematic diagram of a functional structure of a signal verification system according to an embodiment of the present disclosure.

Referring to FIG. 1, the signal verification system includes: a memory controller 10, a memory 11, and a first transmission path 121 and a second transmission path 122 connected between the memory controller 10 and the memory 11, where the memory controller 10 sends to-be-check signal through the first transmission path 121, and sends a check signal through the second transmission path 122, where the second transmission path 122 is a single-port channel, and the check signal is a multi-bit signal; conversion components, including a first conversion component 131 and a second conversion component 132, where the first conversion component 131 is connected to an output end of the first transmission path 121, the second conversion component 132 is connected to an input end of the second transmission path 122, and the conversion components are configured to convert the to-be-check signal into the check signal; and a comparison module 17, located in the memory 11, connected to an output end of the first conversion component 131 and an output end of the second transmission path 122, and configured to obtain and compare an output signal of the first conversion component 131 and an output signal of the second transmission path 122.

In this embodiment, the to-be-check signals include a plurality of single-bit signals, the first transmission path 121 is a multi-port channel, and each port is configured to send one single-bit signal. The conversion components are configured to convert the plurality of single-bit signals into one multi-bit signal. In other embodiments, the to-be-check signal may be alternatively one multi-bit signal, or at least one single-bit signal and at least one multi-bit signal.

The single-bit signal may be flipped during transmission through the first transmission path 121, including flipped from 0 to 1 and flipped from 1 to 0. Consequently, an output signal and an input signal of the first transmission path 121 may be different, that is, a to-be-check signal received by the memory 11 may be different from a to-be-check signal sent by the memory controller 10. Further, after the conversion by the first conversion component 131, the converted signal may be different from the check signal transmitted through the second transmission path 122. In this way, through comparison with the correct check signal output through the second transmission path 122, it may be determined, according to a comparison result, whether the to-be-check signal is flipped on the first transmission path 121 during transmission.

In this embodiment, the output end of the first transmission path 121 may be connected to another functional module. When the comparison result of the comparison module 17 indicates equality, it may be considered that the to-be-check signal transmitted on the first transmission path 121 is not flipped during transmission, that is, the to-be-check signal received by the memory 11 is the same as the to-be-check signal sent by the memory controller 10. In this case, the functional module can execute the signal received by the memory 11, and another system including the functional module can operate effectively according to a preset plan.

In this embodiment, each conversion component includes a compression module, configured to convert n single-bit signals into a multi-bit signal including k bits, and the multi-bit signal including k bits is used as the check signal, where n>k. Because the check signal has a smaller data volume than the to-be-check signal, a transmission rate and a comparison calculation rate of the check signal are higher. This helps improve an operation rate of the signal verification system.

The first conversion component 131 and the second conversion component 132 have compression modules with a same function. The compression module in the first conversion component 131 is configured to compress and convert the to-be-check signal transmitted by the first transmission path 121. The compression module in the second conversion component 132 is configured to compress and convert the to-be-check signal sent by the memory controller 10.

In this embodiment, the compression module includes a first addition unit 141 and remainder units 15. The remainder units 15 are connected to an output end of the first addition unit 141. The first addition unit 141 is configured to receive a plurality of single-bit signals and perform an addition operation on the plurality of single-bit signals. The remainder units 15 are configured to perform a remainder operation on a result of the addition operation. A remainder value is used as a value of at least one bit of the check signal.

After the first addition unit 141 and the remainder units 15 are used to compress the plurality of single-bit signals, it can be determined, according to a finally output remainder value, whether an error occurs in the to-be-check signal during transmission. In other words, when a remainder value output by the first conversion component 131 is different from a remainder value output by the second transmission path 122, it is considered that an error such as flipping or loss occurs in the to-be-check signal on the first transmission path 121 during transmission. In addition, a quantity of bits occupied by the finally output remainder value and a range in which the remainder value can be used for error detection vary depending on a divisor of the remainder units 15.

For example, when the divisor of the remainder units 15 is 2, the remainder value occupies one bit, and the remainder value is 0 or 1, and error detection can be implemented when an odd-numbered change occurs in an added value of the plurality of single-bit signals. Initially, the plurality of single-bit signals are 0001111, the added value is 4, and the remainder value is 0. After transmission and flipping, the plurality of single-bit signals are 1101110, the added value is 5, and the remainder value is 1. Alternatively, after flipping, the plurality of single-bit signals are 1110000, the added value is 3, and the remainder value is 1. Alternatively, after flipping, the plurality of single-bit signals are 1000000, the added value is 1, and the remainder value is 1. In other words, when an odd-numbered change occurs in the added value of the plurality of single-bit signals, the remainder value of the added value changes from 0 to 1. In this case, the comparison module 17 can implement error detection.

That an odd-numbered change occurs in the added value means that, as an odd number of single-bit signals are flipped, an odd-numbered change occurs in the added value of the plurality of single-bit signals, and a quantity of flipped single-bit signals is not necessarily equal to a change value of the added value of the plurality of single-bit signals. In addition, error detection means that it can be determined, according to the comparison result, that an error occurs in the to-be-check signal during transmission.

That an odd-numbered change occurs in the added value may be equivalent to abs[num(1)−num(0)]=2n+1, where abs is an absolute value, num(1) is a quantity of bits having values flipped from 1 to 0, num(0) is a quantity of bits having values flipped from 0 to 1, and n is a natural number.

In addition, when the divisor of the remainder units 15 is 3, the remainder value occupies two bits, and the remainder value is 00, 01, or 10. Error detection can be implemented when an even-numbered change occurs in the added value of the plurality of single-bit signals. It should be noted that, the even-numbered change herein means that the added value changes by 2 or changes by 4, and does not include a larger change of 6. When the single-bit signal is flipped due to an error, there is little probability that the change of the added value exceeds 4. Therefore, use of 3 as the divisor can be considered as being capable of implementing error detection on the even-numbered change in the added value. The divisor can be adjusted if a more precise calculation is required.

That an even-numbered change occurs in the added value means that, as an even number of single-bit signals are flipped, an even-numbered change occurs in the added value of the plurality of single-bit signals, and a quantity of flipped single-bit signals is not necessarily equal to a change value of the added value of the plurality of single-bit signals.

Initial, the plurality of single-bit signals are 0001111, the added value is 4, and the remainder value is 01. After flipping, the plurality of single-bit signals are 0001100, the added value is 2, and the remainder value is 10. Alternatively, after flipping, the plurality of single-bit signals are 0000000, the added value is 0, and the remainder value is 00. In other words, when the added value of the plurality of single-bit signals changes by 2 or 4, the remainder value changes from 01 to 10 or 00. In this case, the comparison module can implement error detection.

That the added value changes by 2 or 4 may be equivalent to abs[num(1)−num(0)]=2/4.

In this embodiment, the remainder units 15 include a first remainder unit 151 and a second remainder unit 152 connected in parallel. A divisor of the first remainder unit 151 is different from a divisor of the second remainder unit 152.

A first remainder value of the first remainder unit 151 and a second remainder value of the second remainder unit 152 are each used as a value of at least one bit of the check signal. A plurality of remainder units with different divisors are used to calculate the remainder of the added value, and each remainder value is used as at least one bit of the check signal, so that error detection of any change number other than a common multiple of the different divisors can be covered, thereby effectively improving signal verification accuracy.

In this embodiment, the divisor of the first remainder unit 151 is 2, and the divisor of the second remainder unit 152 is 3, so that error detection of at least change numbers 1 to 5 of the added value are covered. In other embodiments, a quantity and divisors of remainder units can be adjusted according to a signal transmission environment, a quantity of single-bit signals included in the to-be-check signals, and a limitation on bits of the check signal, to implement more accurate error detection or a higher data processing rate.

In this embodiment, the compression module further includes a first exclusive OR operation unit 161, a second addition unit 142, and a third remainder unit 153 that are sequentially connected. The first exclusive OR operation unit 161 is configured to receive the plurality of single-bit signals forming the to-be-check signals and perform an exclusive OR operation on the first 2 to n signals of the n single-bit signals, to obtain n−1 exclusive OR values. The second addition unit 142 is configured to perform an addition operation on the n−1 exclusive OR values. The third remainder unit 153 is configured to perform a remainder operation on a result of the addition operation. A third remainder value of the third remainder unit 153 is used as a value of at least one bit of the check signal.

It is assumed that the to-be-check signals includes n single-bit signals, n=7, and the seven single-bit signals are respectively denoted as a, b, c, d, e, f, and g. The performing an exclusive OR operation on the first 2 to n signals of the n single-bit signals to obtain n−1 exclusive OR values means: performing the exclusive OR operation on a and b to obtain A, that is, $A = a \oplus b$; performing the exclusive OR operation on a, b, and c to obtain B, that is, $B = a \oplus b \oplus c$; similarly, obtaining C, where $C = a \oplus b \oplus c \oplus d$; obtaining D, where $D = a \oplus b \oplus c \oplus d \oplus e$; obtaining E, where $E = a \oplus b \oplus c \oplus d \oplus e \oplus f$; and obtaining F, where $F = a \oplus b \oplus c \oplus d \oplus e \oplus f \oplus g$.

The first exclusive OR operation unit 161, the second addition unit 142, and the third remainder unit 153 that are sequentially connected are configured to perform error detection on the case in which abs[num(1)−num(0)]=0. When abs[num(1)−num(0)]=0, the added value of the plurality of single-bit signals does not change. Therefore, the error detection cannot be performed directly through addition and remainder calculation.

For example, the to-be-check signals are 0001111, flipped to-be-check signals output by the first transmission path 121 are 0010111, num(1)=num(0)=1, and the added value of the plurality of single-bit signals before and after flipping is 4. Therefore, the error detection cannot be performed through addition and remainder calculation.

Correspondingly, after the first exclusive OR operation unit 161 in the second conversion component 132 performs the exclusive OR operation on the first 2 to n signals of the n single-bit signals, n−1 exclusive OR values, namely, 001010, can be obtained, and the added value of the n−1 exclusive OR values is 2. After the first exclusive OR operation unit in the first conversion component 131 performs the exclusive OR operation on the first 2 to n signals of the n flipped single-bit signals, n−1 exclusive OR values, namely, 011010, can also be obtained, and the added value of the n−1 exclusive OR values is 3. In this case, the error detection can be performed by performing a remainder operation on the added value of the n−1 exclusive OR values. A divisor of the third remainder unit 153 is 2.

It should be noted that, an error detection range of the first exclusive OR operation unit 161, the second addition unit 142, and the third remainder unit 153 that are sequentially connected is related to the divisor of the third remainder unit 153. When the divisor is set to 2, the error detection can be effectively performed only when a change value of the added value of the n−1 exclusive OR values is an odd number, for example, the added value changes from 4 to 5. When the change value of the added value is 2, a further detection means or an increase in the divisor of the third remainder unit 153 is required, for example, the divisor is set to 3.

When the divisor is 3, the error detection can be effectively performed on the change value of 1 to 2 of the added value of the n−1 exclusive OR values by using two bits.

Figure 2:
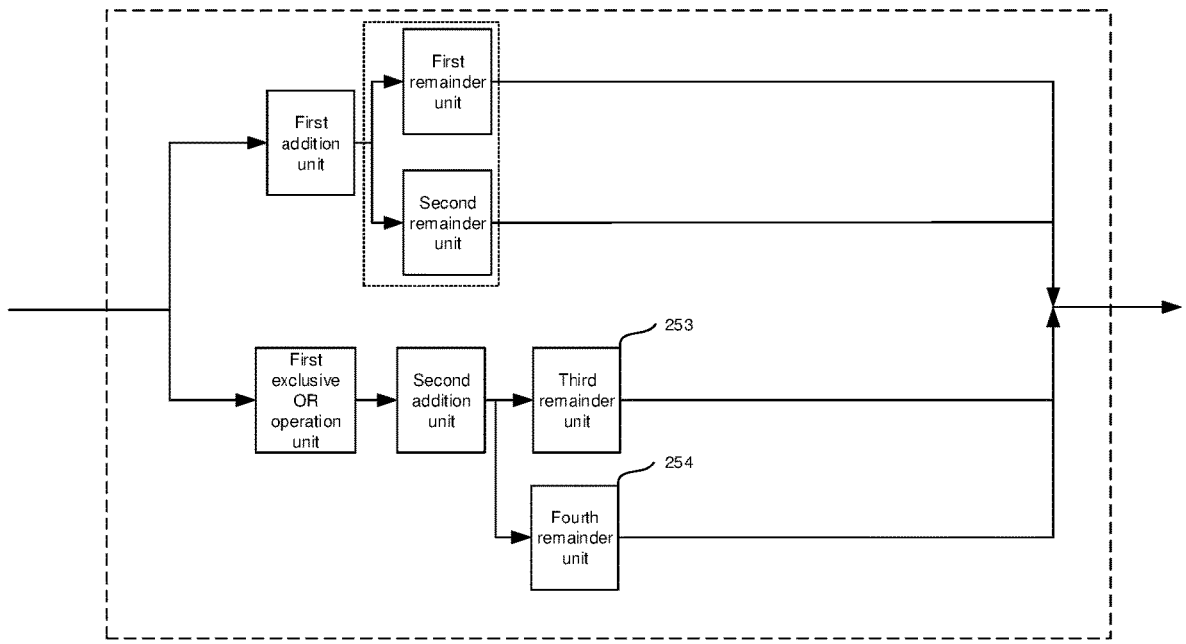
FIG. 2 is a schematic diagram of a functional structure of a signal verification system according to another embodiment of the present disclosure.

In other embodiments, referring to FIG. 2, the compression module further includes a fourth remainder unit 254 connected in parallel to a third remainder unit 253. A divisor of the fourth remainder unit 254 is different from a divisor of the third remainder unit 253. A fourth remainder value of the fourth remainder unit 254 is used as a value of at least one bit of the check signal. The divisor of the third remainder unit 253 may be 2, and the divisor of the fourth remainder unit 254 may be 3. In this way, the error detection can be effectively implemented when the change value of the added value of the n−1 exclusive OR values is 2 or 4.

In this embodiment, the signal verification system further includes: a sampling module 18, connected between the output end of the second transmission path 122 and the comparison module 17, and configured to sample the output signal of the second transmission path 122 and send the sampled signal to the comparison module 17. The sampling module 18 is configured to perform sampling at a rising edge and/or a falling edge of an input clock of the memory 11.

In this embodiment, the signal verification system further includes: a control module 19, connected between the comparison module 17 and the memory controller 10, and configured to receive a comparison result output by the comparison module 17 and control, when the comparison result indicates inequality, the memory controller 10 to resend the to-be-check signal.

The to-be-check signal includes command and address signals applied to the memory 11.

In this embodiment, the converted check signal is transmitted through the single-port channel. Because the check signal is a multi-bit signal, transmission through the single-port channel helps reduce a transmission error probability of a check signal, thereby ensuring accuracy of the check signal output through the second transmission path, and improving accuracy of a signal verification result. In addition, the comparison module is located in the memory, so that a path through which the to-be-check signal is transmitted to the comparison module and a path through which the to-be-check signal is transmitted to another functional module of the memory are located near each other and are similar in length, thereby ensuring that a to-be-check signal received by the first conversion component is the same as a to-be-check signal received by the another functional module of the memory, thereby making the signal verification result of the comparison module valid.

The embodiments or implementations of this specification are described in a progressive manner, and each embodiment focuses on differences from other embodiments. The same or similar parts between the embodiments may refer to each other.

In the description of this specification, the description with reference to the terms "embodiments", "exemplary embodiments", "some implementations", "exemplary implementations", "examples", and the like means that the specific features, structures, materials, or characteristics described in conjunction with the implementations or examples are included in at least one implementation or example of the present disclosure.

In this specification, the schematic expression of the above terms does not necessarily refer to the same implementation or example. Moreover, the described specific features, structures, materials, or characteristics may be combined in an appropriate manner in any one or more implementations or examples.

In the description of the present disclosure, it should be noted that orientations or position relationships indicated by terms "center", "top", "bottom", "left", "right", "vertical", "horizontal", "inner", "outer", and the like are orientation or position relationships shown in the accompanying drawings, and these terms are used only to facilitate description of the present disclosure and simplify the description, but not to indicate or imply that the mentioned apparatuses or elements must have a specific orientation or must be constructed and operated in a specific orientation. Therefore, these terms should not be understood as a limitation on the present disclosure.

It can be understood that the terms "first", "second", and the like used in the present disclosure can be used in the present disclosure to describe various structures, but these structures are not limited by these terms. These terms are used only to distinguish a first structure from another structure.

In one or more accompanying drawings, the same elements are represented by similar reference numerals. For clarity, a plurality of parts of the accompanying drawings are not drawn to scale. In addition, some well-known parts may not be shown. For brevity, a structure obtained after several steps can be illustrated in one figure. Many particular details of the present disclosure, such as the structure, material, size, processing process, and technology of the device, are described below for a clearer understanding of the present disclosure. However, as can be understood by persons skilled in the art, the present disclosure may be implemented without following these particular details.

Finally, it should be noted that the foregoing embodiments are used only to explain the technical solutions of the present disclosure, but are not intended to limit the present disclosure. Although the present disclosure has been described in detail with reference to the foregoing embodiments, persons of ordinary skill in the art should understand that they can still modify the technical solutions described in the foregoing embodiments, or make equivalent substitutions on some or all technical features therein. The modifications or substitutions do not make the essence of the corresponding technical solutions deviate from the spirit and scope of the technical solutions of the embodiments of the present disclosure.

INDUSTRIAL APPLICABILITY

In the signal verification system provided in the present disclosure, a to-be-check signal is converted into a multi-bit signal and transmitted through a single-port channel. This helps reduce a transmission error probability of a check signal, thereby ensuring that a signal received by a comparison module through a second transmission path is a correct check signal, and improving accuracy of a signal verification result. In addition, the comparison module is located in a memory, so that a path through which the to-be-check signal is transmitted to the comparison module and a path through which the to-be-check signal is transmitted to another functional module of the memory are located near each other and are similar in length, thereby ensuring that a to-be-check signal received by a first conversion component is the same as a to-be-check signal received by the another functional module of the memory, thereby making the signal verification result of the comparison module valid.

The invention claimed is:

1. A signal verification system, comprising:
a memory controller (10), a memory (11), and a first transmission path (121) and a second transmission path (122) connected between the memory controller (10) and the memory (11), wherein the memory controller (10) sends one or more to-be-check signals through the first transmission path (121), and sends a check signal through the second transmission path (122), wherein the second transmission path (122) is a single-port channel, and the check signal is a multi-bit signal;
conversion components, comprising a first conversion component (131) and a second conversion component (132), wherein the first conversion component (131) is connected to an output end of the first transmission path (121), the second conversion component (132) is connected to an input end of the second transmission path (122), and the conversion components are configured to convert one or more the to-be-check signals into the check signal; and
a comparison module (17), located in the memory (11), connected to an output end of the first conversion component (131) and an output end of the second transmission path (122), and configured to obtain and compare an output signal of the first conversion component (131) and an output signal of the second transmission path (122).

2. The signal verification system according to claim 1, wherein the to-be-check signals comprise a plurality of single-bit signals, the first transmission path is a multi-port channel, and each port is configured to send one single-bit signal; and the conversion component is configured to convert the plurality of single-bit signals into one multi-bit signal.

3. The signal verification system according to claim 2, wherein each of the conversion components comprises a compression module, configured to convert n single-bit signals into a multi-bit signal comprising k bits, and the multi-bit signal comprising k bits is used as the check signal, wherein n>k.

4. The signal verification system according to claim 3, wherein the compression module comprises a first addition unit and remainder units, the remainder units are connected to an output end of the first addition unit, the first addition unit is configured to receive the plurality of single-bit signals and perform an addition operation on the plurality of single-bit signals, the remainder units are configured to perform a remainder operation on a result of the addition operation, and a remainder value is used as a value of at least one bit of the check signal.

5. The signal verification system according to claim 4, wherein the remainder units comprise a first remainder unit and a second remainder unit connected in parallel, a divisor of the first remainder unit is different from a divisor of the second remainder unit, and a first remainder value of the first remainder unit and a second remainder value of the second remainder unit are each used as a value of at least one bit of the check signal.

6. The signal verification system according to claim 5, wherein the divisor of the first remainder unit is 2, and the divisor of the second remainder unit is 3.

7. The signal verification system according to claim 4, wherein the compression module further comprises a first exclusive OR operation unit, a second addition unit, and a third remainder unit that are sequentially connected, the first exclusive OR operation unit is configured to receive the plurality of single-bit signals and perform an exclusive OR operation on the first 2 to n signals of the n single-bit signals, to obtain n−1 exclusive OR values, the second addition unit is configured to perform an addition operation on the n−1 exclusive OR values, the third remainder unit is configured to perform a remainder operation on a result of the addition operation, and a third remainder value of the third remainder unit is used as a value of at least one bit of the check signal, wherein n is greater than 1.

8. The signal verification system according to claim 7, wherein a divisor of the third remainder unit is 2.

9. The signal verification system according to claim 7, wherein the compression module further comprises a fourth remainder unit connected in parallel to the third remainder unit, a divisor of the fourth remainder unit is different from a divisor of the third remainder unit, and a fourth remainder value of the fourth remainder unit is used as a value of at least one bit of the check signal.

10. The signal verification system according to claim 1, further comprising: a sampling module, configured to sample the output signal of the second transmission path and send a sampled signal to the comparison module.

11. The signal verification system according to claim 10, wherein the sampling module is configured to perform sampling at a rising edge and/or a falling edge of an input clock of the memory.

12. The signal verification system according to claim 1, further comprising a control module, wherein the control module is connected between the comparison module and the memory controller, and configured to receive a comparison result output by the comparison module and control, when the comparison result indicates inequality, the memory controller to resend one or more the to-be-check signals.

13. The signal verification system according to claim 1, wherein one or more the to-be-check signals comprise command and address signals applied to the memory.

* * * * *